(12) United States Patent
Chen et al.

(10) Patent No.: US 12,063,470 B1
(45) Date of Patent: Aug. 13, 2024

(54) ACOUSTIC PACKAGE STRUCTURE AND COVERING STRUCTURE

(71) Applicant: xMEMS Labs, Inc., Santa Clara, CA (US)

(72) Inventors: Chao-Yu Chen, Kaohsiung (TW); Wen-Chien Chen, New Taipei (TW); Chiung C. Lo, San Jose, CA (US); Hai-Hung Wen, Hsinchu County (TW)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/335,159

(22) Filed: Jun. 15, 2023

Related U.S. Application Data

(60) Provisional application No. 63/444,577, filed on Feb. 10, 2023.

(51) Int. Cl.
| | |
|---|---|
| *H04R 1/28* | (2006.01) |
| *B81B 7/00* | (2006.01) |
| *H04R 1/02* | (2006.01) |
| *H04R 7/04* | (2006.01) |
| *H04R 19/00* | (2006.01) |

(52) U.S. Cl.
CPC .......... *H04R 1/2811* (2013.01); *B81B 7/0061* (2013.01); *H04R 1/025* (2013.01); *H04R 7/04* (2013.01); *H04R 19/00* (2013.01); *B81B 2201/0257* (2013.01); *B81B 2203/0127* (2013.01); *H04R 2201/003* (2013.01)

(58) Field of Classification Search
CPC ........ H04R 1/2811; H04R 1/025; H04R 7/04; H04R 19/00; H04R 2201/003; B81B 7/0061; B81B 2201/0257; B81B 2203/0127; B81B 2201/0264; B81B 2207/07; B81B 7/0048; B81B 7/0054; B81B 7/0051; B81B 7/02; B81B 7/0058; B81B 7/0038; B81B 2207/015; H01L 23/053; H01L 23/13; H01L 23/4985; H01L 2224/16; H01L 23/315; G01L 1/005; G01L 9/00; G01L 9/0042; G01L 9/0054; B81C 1/00325; B81C 2201/0116; B81C 1/00261; B81C 1/00285; B81C 2203/01

See application file for complete search history.

(56) References Cited

U.S. PATENT DOCUMENTS

| | | | |
|---|---|---|---|
| 6,944,308 B2 * | 9/2005 | Gullov | H04R 19/00 381/174 |
| 10,327,077 B2 | 6/2019 | Yoo | |
| 10,440,481 B2 | 10/2019 | Kasai | |
| 11,350,217 B2 | 5/2022 | Stoppel | |
| 2007/0147650 A1 | 6/2007 | Lee | |

(Continued)

FOREIGN PATENT DOCUMENTS

| | | | |
|---|---|---|---|
| CN | 115243150 A | * | 10/2022 |
| JP | 2011-44890 A | | 3/2011 |

(Continued)

*Primary Examiner* — Angelica M McKinney
(74) *Attorney, Agent, or Firm* — Winston Hsu

(57) ABSTRACT

An acoustic package structure includes a substrate, a covering structure and an acoustic chip. The covering structure is disposed on the substrate and has a plurality of first openings. The acoustic chip is disposed between the substrate and the covering structure, wherein the acoustic chip includes a membrane.

18 Claims, 3 Drawing Sheets

(56) References Cited

U.S. PATENT DOCUMENTS

| | | |
|---|---|---|
| 2009/0218668 A1* | 9/2009 | Zhe .................... B81C 1/00309 257/E23.18 |
| 2013/0018218 A1 | 1/2013 | Haller |
| 2013/0223023 A1 | 8/2013 | Dehe |
| 2014/0121449 A1 | 5/2014 | Kasic |
| 2014/0121450 A1 | 5/2014 | Kasic |
| 2014/0177881 A1* | 6/2014 | Fanget ............... H10N 30/1071 310/317 |
| 2015/0284242 A1* | 10/2015 | Saito .................... B81B 7/0058 257/415 |
| 2016/0122181 A1* | 5/2016 | Picco ................... B81B 7/0048 257/419 |
| 2016/0176704 A1 | 6/2016 | Cargill |
| 2017/0325030 A1 | 11/2017 | Stoppel |
| 2019/0039880 A1* | 2/2019 | Paci .................. H10N 30/2047 |
| 2019/0082268 A1 | 3/2019 | Yoo |
| 2020/0033321 A1* | 1/2020 | Liu ..................... B81C 1/00119 |
| 2020/0059721 A1 | 2/2020 | Hong |
| 2020/0100033 A1 | 3/2020 | Stoppel |
| 2020/0283287 A1* | 9/2020 | Hammerschmidt .. H01L 23/053 |
| 2020/0402884 A1* | 12/2020 | Wan ........................ H01L 23/04 |
| 2021/0092500 A1* | 3/2021 | Lo ........................ H04R 19/005 |
| 2021/0329386 A1* | 10/2021 | Wen ........................ H04R 7/04 |
| 2022/0014836 A1* | 1/2022 | Liang .................. H04R 1/1058 |
| 2022/0329951 A1 | 10/2022 | Umezawa |

FOREIGN PATENT DOCUMENTS

| | | | |
|---|---|---|---|
| JP | 2017-163408 A | 9/2017 | |
| JP | 2018-98546 A | 6/2018 | |
| JP | 2021-52305 A | 4/2021 | |
| JP | 2021-154436 A | 10/2021 | |
| KR | 10-2007-0059941 A | 6/2007 | |
| WO | WO-2019133644 A1 * | 7/2019 | ........... H04R 19/005 |
| WO | 2021/153491 A1 | 8/2021 | |

* cited by examiner

ACOUSTIC PACKAGE STRUCTURE AND COVERING STRUCTURE

CROSS REFERENCE TO RELATED APPLICATIONS

This application claims the benefit of U.S. Provisional Application No. 63/444,577, filed on Feb. 10, 2023. The content of the application is incorporated herein by reference.

BACKGROUND OF THE INVENTION

1. Field of the Invention

The present application relates to an acoustic package structure and a covering structure, and more particularly, to an acoustic package structure and a covering structure having a high protective effect and a low acoustic resistance.

2. Description of the Prior Art

Since acoustic components, such as acoustic MEMS (Micro Electro Mechanical System) structures, can be widely used in various electronic devices due to their small size, the acoustic components are developed rapidly in recent years.

However, the acoustic components need to be protected due to their small sizes and fragility structures. Therefore, it is necessary to provide package structures to protect the acoustic components.

SUMMARY OF THE INVENTION

It is therefore a primary objective of the present invention to provide an acoustic package structure including a covering structure with a plurality of first openings, so as to enhance the protective effect on an acoustic chip and decrease an acoustic resistance of the covering structure. The present invention also provides a related covering structure.

An embodiment of the present invention provides an acoustic package structure including a substrate, a covering structure and an acoustic chip. The covering structure is disposed on the substrate and has a plurality of first openings. The acoustic chip is disposed between the substrate and the covering structure, wherein the acoustic chip includes a membrane.

Another embodiment of the present invention provides a covering structure disposed or to be disposed on a substrate of an acoustic package structure. The covering structure includes a plurality of first openings formed on the covering structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
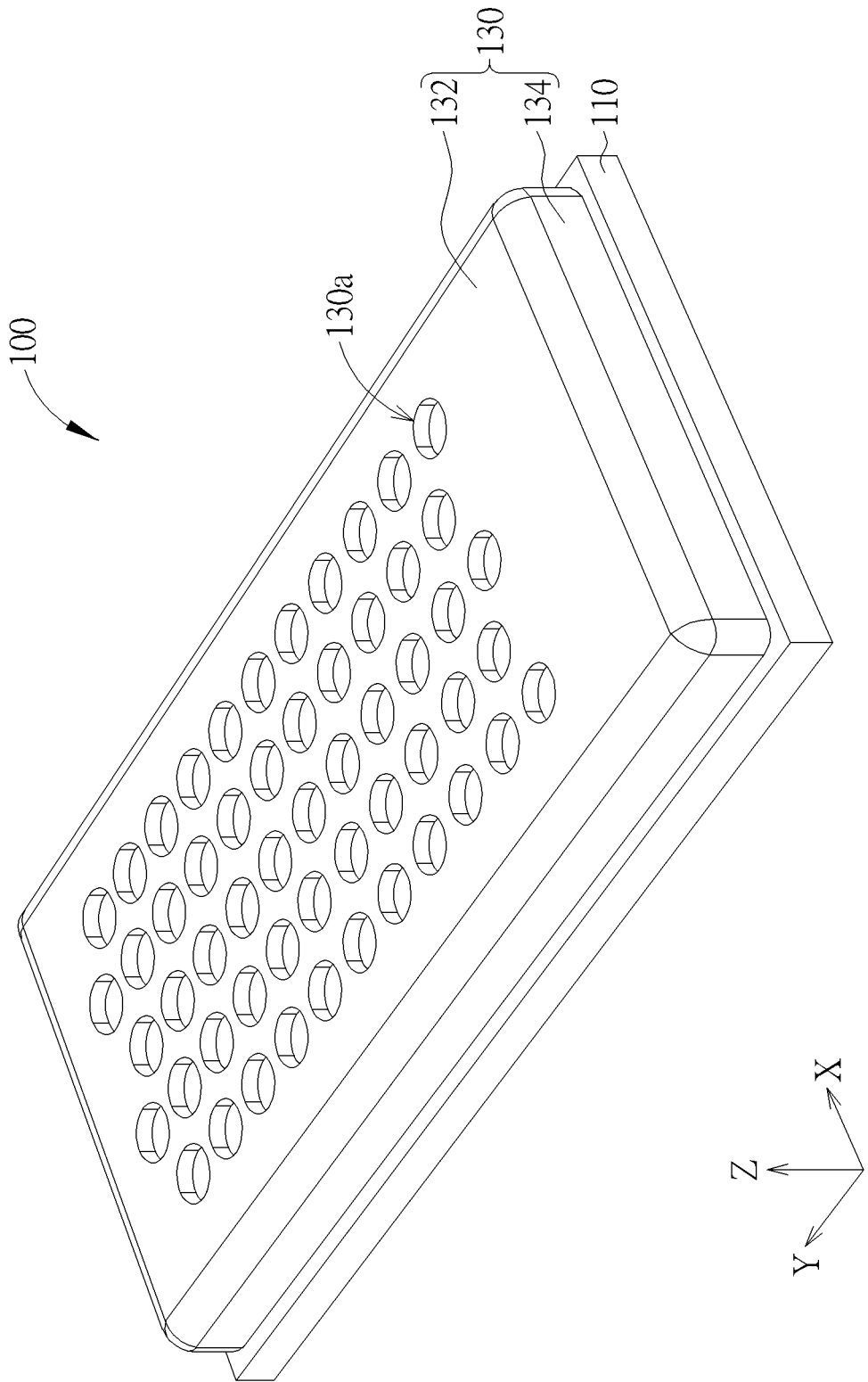
FIG. 1 is a schematic diagram illustrating an acoustic package structure according to an embodiment of the present invention.

To provide a better understanding of the present invention to those skilled in the art, preferred embodiments and typical material or range parameters for key components will be detailed in the follow description. These preferred embodiments of the present invention are illustrated in the accompanying drawings with numbered elements to elaborate on the contents and effects to be achieved. It should be noted that the drawings are simplified schematics, and the material and parameter ranges of key components are illustrative based on the present day technology, and therefore show only the components and combinations associated with the present invention, so as to provide a clearer description for the basic structure, implementing or operation method of the present invention. The components would be more complex in reality and the ranges of parameters or material used may evolve as technology progresses in the future. In addition, for ease of explanation, the components shown in the drawings may not represent their actual number, shape, and dimensions; details may be adjusted according to design requirements.

In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present invention, the corresponding features, areas, steps, operations and/or components would be pointed to existence, but not limited to the existence of one or a plurality of the corresponding features, areas, steps, operations and/or components.

In the following description and in the claims, when a component or layer is referred to as being "connected to" another component or layer, it can be directly connected to this another component or layer, or intervening components or layers may be presented. In contrast, when a component is referred to as being "directly connected to" another component or layer, there are no intervening components or layers presented.

In the following description and in the claims, when "a A1 component is formed by/of B1", B1 exist in the formation of A1 component or B1 is used in the formation of A1 component, and the existence and use of one or a plurality of other features, areas, steps, operations and/or components are not excluded in the formation of A1 component.

In the following description and in the claims, the term "substantially" generally means a small deviation may exist or not exist. For instance, the terms "substantially parallel" and "substantially along" means that an angle between two components may be less than or equal to a certain degree threshold, e.g., 10 degrees, 5 degrees, 3 degrees or 1 degree. For instance, the term "substantially aligned" means that a deviation between two components may be less than or equal to a certain difference threshold, e.g., 2 μm or 1 μm. For instance, the term "substantially the same" means that a deviation is within, e.g., 10% of a given value or range, or mean within 5%, 3%, 2%, 1%, or 0.5% of a given value or range.

In the description and following claims, the term "horizontal direction" generally means a direction parallel to a horizontal surface, the term "horizontal surface" generally means a surface parallel to a direction X and a direction Y in the drawings (i.e., the direction X and the direction Y of the present invention may be considered as the horizontal directions), the term "vertical direction" generally means a direction parallel to a direction Z and perpendicular to the horizontal direction in the drawings, and the direction X, the direction Y and the direction Z are perpendicular to each other. In the description and following claims, the term "top view" generally means a viewing result viewing along one vertical direction, and the term "cross-sectional view" generally means a viewing result viewing a structure cutting along the vertical direction along the horizontal direction.

Although terms such as first, second, third, etc., may be used to describe diverse constituent elements, such constituent elements are not limited by the terms. The terms are used only to discriminate a constituent element from other constituent elements in the specification, and the terms do not relate to the sequence of the manufacture if the specification do not describe. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present invention.

Figure 2:
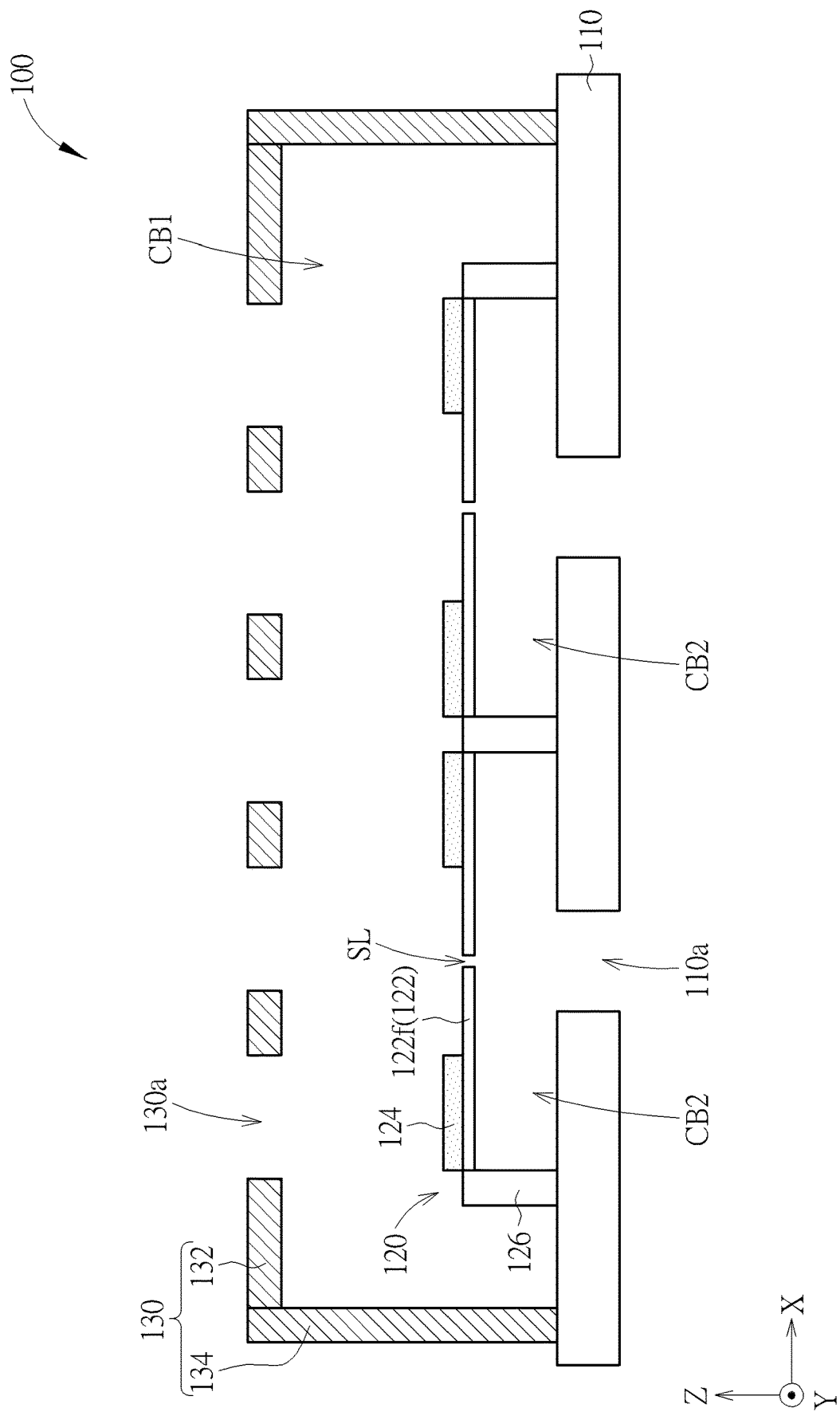
FIG. 2 is a schematic diagram of cross sectional view illustrating an acoustic package structure according to an embodiment of the present invention.

Referring to FIG. 1 and FIG. 2, FIG. 1 is a schematic diagram illustrating an acoustic package structure according to an embodiment of the present invention, and FIG. 2 is a schematic diagram of cross sectional view illustrating an acoustic package structure according to an embodiment of the present invention. As shown in FIG. 1 and FIG. 2, the acoustic package structure 100 includes an acoustic chip 120. The acoustic chip 120 may be related to an acoustic wave (e.g., the acoustic chip 120 generates the acoustic wave or receives the acoustic wave, or the acoustic chip 120 may be a path which the acoustic wave passes through), and/or the acoustic chip 120 may enhance the experience of the user using an acoustic device including this acoustic chip 120, wherein the acoustic wave may be a sound wave or an ultrasonic wave. The acoustic chip 120 may be controlled by signals or may generate signals according to an acoustic wave, wherein the signals may be electric signals or signals with other suitable type.

In some embodiments, the acoustic chip 120 may include an acoustic transducer configured to perform an acoustic transformation, wherein the acoustic transformation may convert the signals (e.g. electric signals) into an acoustic wave, or may convert an acoustic wave into signals with other suitable type (e.g. electric signals). For example, the acoustic transducer may be a sound producing component, a speaker, a micro speaker or other suitable device, so as to convert the electric signals into the acoustic wave, but not limited thereto. For example, the acoustic transducer may be a sound measuring device, a sound pressure sensing device, a microphone or other suitable device, so as to convert the acoustic wave into the electric signals, but not limited thereto.

In some embodiments, the acoustic chip 120 may be controlled by the electric signal. For example, the acoustic chip 120 may include a venting device, and a size of a venting opening of the venting device may be controlled by the electric signal. For example, the venting device may be configured to suppress an occlusion effect during the operation of the acoustic device (e.g., an in-ear earbud, an on-ear earphone or an over-ear earphone, etc.). The occlusion effect is due to the sealed volume of ear canal causing loud perceived sound pressure by the user (i.e., the listener). In some cases, the occlusion effect occurs while the user does specific motion(s) generating a bone-conducted sound (such as walking, jogging, talking, eating, touching the acoustic transducer, etc.) and uses the acoustic device filled in the user's ear canal, and the occlusion effect causes the user to hear the occlusion noise, thereby decreasing the listening quality of the user. Thus, because of the existence of the venting device, the volume of ear canal is not sealed when the venting opening of the venting device is opened, such that the occlusion effect may be suppressed, thereby enhancing the performance of the acoustic device and the experience of the user using the acoustic device.

In some embodiments, the acoustic chip 120 may be a MEMS (Micro Electro Mechanical System) chip, but not limited thereto. Namely, the above component (e.g., the acoustic transducer, the venting device or any other suitable component related to acoustics) in the acoustic chip 120 may be a MEMS structure formed by semiconductor process, but not limited thereto.

In the following, for instance, the acoustic chip 120 may include the acoustic transducer configured to convert the electric signals into the acoustic wave (i.e., the acoustic chip 120 may perform the acoustic transformation to generate the acoustic wave), but not limited thereto.

As shown in FIG. 2, the acoustic chip 120 includes an anchor structure 126 and a membrane 122 anchored by the anchor structure 126. The membrane 122 and the anchor structure 126 may be formed of any suitable material. For example, the membrane 122 and the anchor structure 126 may individually include silicon (e.g., single crystalline silicon or poly-crystalline silicon), silicon compound (e.g., silicon carbide, silicon oxide), germanium, germanium compound, gallium, gallium compound (e.g., gallium nitride or gallium arsenide) or a combination thereof, but not limited thereto. In some embodiments, the membrane 122 and the anchor structure 126 may have the same material.

Since the acoustic chip 120 includes the acoustic transducer for instance, the membrane 122 may belong to the acoustic transducer and be actuated to perform the acoustic transformation, such that the membrane 122 may generate the acoustic wave.

In the operation of the acoustic chip 120, the membrane 122 may be actuated to have a movement, and the anchor structure 126 may be immobilized. Namely, the anchor structure 126 may be a fixed end (or fixed edge) respecting the membrane 122 during the operation of the acoustic chip 120. In some embodiments, the membrane 122 may be actuated to move upwards and downwards, but not limited thereto. In the present invention, the terms "move upwards" and "move downwards" represent that the membrane 122 moves substantially along the direction Z.

The membrane 122 may be designed based on requirement(s). In FIG. 2, the membrane 122 has a plurality of flaps 122f divided by at least one slit SL, and the flaps 122f may be actuated to move in the direction Z. For example, in the membrane 122 shown in FIG. 2, two flaps 122f may be divided by one slit SL, but not limited thereto.

The frequency range of the acoustic wave produced by each acoustic chip 120 may be designed based on requirement(s). For instance, an embodiment of acoustic chip 120 may produce the acoustic wave with the frequency range covering the human audible frequency range (e.g., from 20 Hz to 20 kHz), but not limited thereto. For instance, another embodiment of acoustic chip 120 may produce the acoustic wave with the frequency higher than a specific frequency, such that this acoustic chip 120 may be a high frequency sound unit (tweeter), but not limited thereto. For instance, another embodiment of acoustic chip 120 may produce the acoustic wave with the frequency lower than a specific frequency, such that this acoustic chip 120 may be a low frequency sound unit (woofer), but not limited thereto. Note that the specific frequency may be a value ranging from 800 Hz to 4 kHz (e.g., 1.44 kHz), but not limited thereto. The details of the high frequency sound unit and the low frequency sound unit may be referred to U.S. application Ser. No. 17/153,849 filed by Applicant, which is not narrated herein for brevity.

The number of the acoustic chip(s) 120 may be designed based on requirement(s). For example, in FIG. 2, the acoustic package structure 100 may have two acoustic chips 120, and the frequency ranges of the acoustic waves produced by two acoustic chips 120 may be the same or different, but not limited thereto.

The acoustic chip 120 may include any suitable component. As shown in FIG. 2, the acoustic chip 120 may include an actuator 124 configured to actuate the membrane 122, so as to make the membrane 122 to generate the acoustic wave. For example, the actuator 124 is disposed on the membrane 122, but not limited thereto.

The membrane 122 may be actuated by any suitable actuating method. In the present invention, the actuator 124 has a monotonic electromechanical converting function with respect to the movement of the membrane 122 along a direction (e.g., the direction Z). In some embodiments, the actuator 124 may include a piezoelectric actuator, an electrostatic actuator, a nanoscopic-electrostatic-drive (NED) actuator, an electromagnetic actuator or any other suitable actuator, but not limited thereto. For example, in an embodiment, the actuator 124 may include a piezoelectric actuator, the piezoelectric actuator may contain such as two electrodes and a piezoelectric material layer (e.g., lead zirconate titanate, PZT) disposed between the electrodes, wherein the piezoelectric material layer may actuate the membrane 122 based on driving signals (e.g., driving voltages and/or driving voltage difference between two electrodes) received by the electrodes, but not limited thereto. For example, in another embodiment, the actuator 124 may include an electromagnetic actuator (such as a planar coil), wherein the electromagnetic actuator may actuate the membrane 122 based on a received driving signals (e.g., driving current) and a magnetic field (i.e. the membrane 122 may be actuated by the electromagnetic force), but not limited thereto. For example, in still another embodiment, the actuator 124 may include an electrostatic actuator (such as conducting plate) or a NED actuator, wherein the electrostatic actuator or the NED actuator may actuate the membrane 122 based on a received driving signals (e.g., driving voltage) and an electrostatic field (i.e. the membrane 122 may be actuated by the electrostatic force), but not limited thereto.

As shown in FIG. 1 and FIG. 2, the acoustic package structure 100 includes a substrate 110 and a covering structure 130 disposed on the substrate 110, wherein the acoustic chip 120 is disposed between the substrate 110 and the covering structure 130. In FIG. 2, a first cavity CB1 exists between the covering structure 130 and the acoustic chip 120, and a second cavity CB2 exists between the substrate 110 and the acoustic chip 120. For instance, since the acoustic package structure 100 includes two acoustic chips 120 in FIG. 2, the acoustic package structure 100 has one first cavity CB1 and two second cavities CB2, wherein the first cavity CB1 exists between the covering structure 130 and two acoustic chips 120, one of the second cavities CB2 exists between the substrate 110 and one of the acoustic chips 120, and another one of the second cavities CB2 exists between the substrate 110 and another one of the acoustic chips 120.

The substrate 110 may be designed based on requirement(s). In some embodiments, the substrate 110 may be hard or flexible, wherein the substrate 110 may include silicon, germanium, glass, plastic, quartz, sapphire, metal, polymer (e.g., polyimide (PI), polyethylene terephthalate (PET)), any other suitable material or a combination thereof. As an example, the substrate 110 may be a circuit board including a laminate (e.g., copper clad laminate, CCL), a land grid array (LGA) board or any other suitable board containing conductive material, but not limited thereto. As shown in FIG. 1 and FIG. 2, a normal direction of the substrate 110 may be parallel to the direction Z, but not limited thereto.

The covering structure 130 may be designed based on requirement(s). In the present invention, the covering structure 130 may be a one-piece structure (as shown in FIG. 2) or be composed of a plurality of sub-structures (e.g., the covering structure 130 may be composed of a plurality of board). The covering structure 130 may include any suitable material, such as metal, glass, silicon, germanium, plastic, polymer or a combination thereof, but not limited thereto.

As shown in FIG. 1 and FIG. 2, the covering structure 130 may include a top part 132 and at least one sidewall part 134 connected to the top part 132, such that the covering structure 130 may have a U-shape in the cross sectional view (e.g., FIG. 2). In FIG. 1 and FIG. 2, a normal direction of the top part 132 may be parallel to the direction Z, and a normal direction of the sidewall part 134 may be perpendicular to the direction Z, but not limited thereto.

The acoustic package structure 100 includes at least one opening, so as to make the first cavity CB1 and/or the second cavity CB2 be connected to the outside of acoustic package structure 100. As shown in FIG. 1 and FIG. 2, the covering structure 130 has a plurality of first openings 130a connected to the first cavity CB1, such that the acoustic wave related to the membrane 122 of the acoustic chip 120 passes through the first openings 130a of the covering structure 130.

In the present invention, the first openings 130a may be formed on the top part 132 and/or the sidewall part 134 of the covering structure 130. For example, as shown in FIG. 1 and FIG. 2, the top part 132 may have all of the first openings 130a, but not limited thereto.

In the present invention, the first openings 130a may be designed based on requirement(s). For example, the first openings 130a may be arranged in a plurality of columns extending along the direction X and/or a plurality of rows extending along the direction Y, but not limited thereto. For example, the first openings 130a may be arranged in an array, but not limited thereto. For example, a top-view pattern of the first opening 130a may be a hexagon, a circle or other suitable shape.

In some embodiments, one of the first openings 130a may be corresponding to a region of the acoustic package structure 100 which has a greatest acoustic effectiveness. For instance, this region may produce the acoustic wave with highest sound pressure level (SPL) or may have highest sensitivity of the acoustic wave, or a greatest airflow may pass through this region, but not limited thereto. In an embodiment, as shown in FIG. 1 and FIG. 2, one of the first openings 130a may be situated at a center of the covering structure 130 in a top view, but not limited thereto. In another embodiment (not shown in figures), one of the first openings 130a may be corresponding to a center of the membrane 122 in the normal direction of the substrate 110 (i.e., the direction Z), but not limited thereto.

In the present invention, the size of the first opening 130a may be designed based on requirement(s). In some embodiments, the first opening 130a may be small or significantly small. In some embodiments, the size of the first opening 130a may be less than or equal to 10%, 5%, 3% or 1% of the top part 132 of the covering structure 130, but not limited thereto.

Since the covering structure 130 has a plurality of first openings 130a in the present invention, the covering structure 130 of the present invention would provide a higher physically protecting effect on the acoustic chip 120 than a conventional covering structure having one great opening (e.g., the size of the conventional great opening may be greater than half of a top part of the conventional covering structure, such that the first opening 130a of the present invention is much smaller than the conventional great opening). For example, the covering structure 130 of the present invention may protect the acoustic chip 120 during the subsequent use of the acoustic package structure 100 (e.g., the operation of the acoustic chip 120, the process of disposing the acoustic package structure 100 in an acoustic device and/or other suitable use), so as to enhance the yield rate of the acoustic package structure 100 and the yield rate of the acoustic device, but not limited thereto. Furthermore, outer objects (e.g., dust, particles, sharp objects, etc.) are hard to enter the acoustic package structure 100 due to the existence of the covering structure 130 with a plurality of first openings 130a.

Moreover, the acoustic resistance of the covering structure 130 is related to the total area of the first openings 130a (i.e., the acoustic resistance is decreased as the total area of the first openings 130a is increased). Thus, the acoustic resistance of the covering structure 130 may be decreased by increasing the number of the first openings 130a and/or increasing the size of the first opening 130a. As the result, the covering structure 130 would provide the high protecting effect on the acoustic chip 120 and the low acoustic resistance.

As shown in FIG. 2, the substrate 110 has at least one second opening 110a. In FIG. 2, the second opening 110a may be connected to one second cavity CB2. For example, the substrate 110 has two second openings 110a respectively connected to two second cavities CB2, but not limited thereto.

Figure 3:
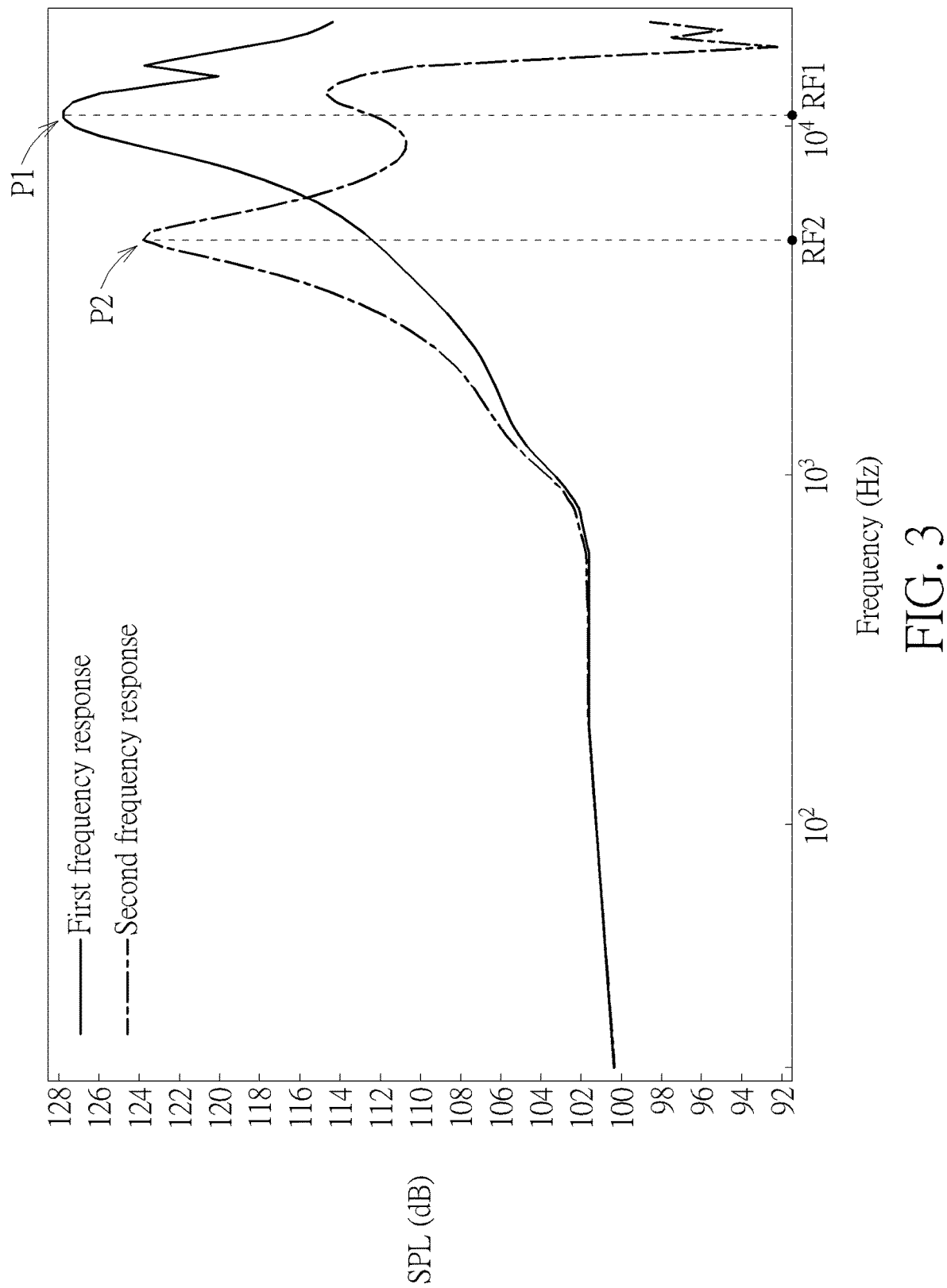
FIG. 3 is a schematic diagram illustrating two frequency responses of membranes of acoustic chips in acoustic package structures according to embodiments of the present invention.

Referring to FIG. 3, FIG. 3 is a schematic diagram illustrating two frequency responses of membranes of acoustic chips in acoustic package structures according to embodiments of the present invention. In FIG. 3, a first frequency response is a frequency response of the membrane 122 of the acoustic chip 120 in a first acoustic package structure, a second frequency response is a frequency response of the membrane 122 of the acoustic chip 120 in a second acoustic package structure, wherein a total area of first openings 130a of a first covering structure of the first acoustic package structure is greater than a total area of first openings 130a of a second covering structure of the second acoustic package structure. For example, in FIG. 3, a ratio of the total area of the first openings 130a of the first acoustic package structure to the total area of the first openings 130a of the second acoustic package structure may range from 150 to 170, but not limited thereto.

As shown in FIG. 3, in the first frequency response, a minimum resonance peak P1 of the membrane 122 in the first acoustic package structure is generated at a first frequency RF1 (i.e., the first frequency RF1 is a minimum resonance frequency of the membrane 122 in the first acoustic package structure) and has a first peak value (i.e., SPL). As shown in FIG. 3, in the second frequency response, a minimum resonance peak P2 of the membrane 122 in the second acoustic package structure is generated at a second frequency RF2 (i.e., the second frequency RF2 is a minimum resonance frequency of the membrane 122 in the second acoustic package structure) and has a second peak value (i.e., SPL).

In FIG. 3, the first frequency RF1 is greater than the second frequency RF2, and the first peak value is greater than the second peak value. Namely, in the acoustic package structure 100, the minimum resonance frequency of the membrane 122 and the peak value of the minimum resonance peak of the membrane 122 are decreased as the total area of the first openings 130a is decreased. In some embodiments, a difference between the first frequency RF1 and the second frequency RF2 may be greater than or equal to 1000 Hz, 2000 Hz, 5000 Hz or other suitable value. For instance, in FIG. 3, a difference between the first frequency RF1 and the second frequency RF2 may be 6000 Hz approximately, but not limited thereto. Thus, in the acoustic package structure 100, the minimum resonance frequency of the membrane 122 and the peak value of the minimum resonance peak of the membrane 122 may be changed by adjusting the total area of the first openings 130a.

In some embodiments, in the first acoustic package structure, the total area of the first openings 130a may be greater than, equal to or similar to a total area of the membrane(s) 122 of the acoustic chip(s) 120. Therefore, a minimum resonance frequency and a peak value of a minimum resonance peak of the membrane 122 of the acoustic chip 120 before disposing in the acoustic package structure 100 may be respectively equal to or similar to the first frequency RF1 and the first peak value in the first frequency response. Accordingly, in some embodiments, the minimum resonance frequency of the membrane 122 of the acoustic chip 120 before disposing in the acoustic package structure 100 may be greater than the minimum resonance frequency of the membrane 122 of the acoustic chip 120 after disposing in the acoustic package structure 100 (e.g., this difference may be greater than or equal to 1000 Hz, 2000 Hz, 5000 Hz or other suitable value based on the total area of the first openings 130a of the covering structure 130). In some embodiments, the peak value of the minimum resonance peak of the membrane 122 of the acoustic chip 120 before disposing in the acoustic package structure 100 may be greater than the peak value of the minimum resonance peak of the membrane 122 of the acoustic chip 120 after disposing in the acoustic package structure 100 (e.g., this difference is related to the total area of the first openings 130a of the covering structure 130).

In summary, because the covering structure of the present invention has a plurality of first openings, the covering structure provides the high protecting effect on the acoustic chip and the low acoustic resistance, and the minimum resonance frequency and the peak value of the minimum resonance peak of the membrane of the acoustic chip in the acoustic package structure would be adjusted based on requirement(s).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An acoustic package structure, comprising:
   a substrate;
   a covering structure disposed on the substrate, wherein the covering structure has a plurality of first openings; and
   an acoustic chip disposed between the substrate and the covering structure, wherein the acoustic chip comprises a membrane and an actuator;
   wherein the actuator is configured to actuate the membrane by an electric signal, so as to drive the membrane to have a movement and to generate an acoustic wave;
   wherein in a first frequency response of the membrane of the acoustic chip before disposing in the acoustic package structure, a first frequency is a minimum resonance frequency of the first frequency response of the membrane;
   wherein in a second frequency response of the membrane of the acoustic chip after disposing in the acoustic package structure, a second frequency is a minimum resonance frequency of the second frequency response of the membrane;
   wherein the first frequency is greater than the second frequency.

2. The acoustic package structure of claim 1, wherein a difference between the first frequency and the second frequency is greater than or equal to 1000 Hz.

3. The acoustic package structure of claim 1,
   wherein in the first frequency response of the membrane of the acoustic chip before disposing in the acoustic package structure, a first peak value is a peak value of a minimum resonance peak of the first frequency response of the membrane;
   wherein in the second frequency response of the membrane of the acoustic chip after disposing in the acoustic package structure, a second peak value is a peak value of a minimum resonance peak of the second frequency response of the membrane;
   wherein the first peak value is greater than the second peak value.

4. The acoustic package structure of claim 1, wherein one of the first openings is situated at a center of the covering structure in a top view.

5. The acoustic package structure of claim 1, wherein one of the first openings is corresponding to a center of the membrane in a normal direction of the substrate.

6. The acoustic package structure of claim 1, wherein a top-view pattern of one of the first openings is a hexagon or a circle.

7. The acoustic package structure of claim 1, wherein the covering structure comprises a top part and at least one sidewall part connected to the top part, and the top part has the first openings.

8. The acoustic package structure of claim 1, wherein the acoustic wave related to the membrane of the acoustic chip passes through the first openings of the covering structure.

9. The acoustic package structure of claim 1, wherein the membrane is configured to perform an acoustic transformation.

10. The acoustic package structure of claim 1, wherein the acoustic chip is a micro electro mechanical system (MEMS) chip.

11. A covering structure, disposed or to be disposed on a substrate of an acoustic package structure, the covering structure comprising:
    a plurality of first openings, formed on the covering structure;
    wherein the acoustic package structure comprises an acoustic chip disposed on the substrate, and the acoustic chip comprises a membrane and an actuator;
    wherein the actuator is configured to actuate the membrane by an electric signal, so as to drive the membrane to have a movement and to generate an acoustic wave;
    wherein in a first frequency response of the membrane of the acoustic chip before disposing in the acoustic package structure, a first frequency is a minimum resonance frequency of the first frequency response of the membrane;
    wherein in a second frequency response of the membrane of the acoustic chip after disposing in the acoustic package structure, a second frequency is a minimum resonance frequency of the second frequency response of the membrane;
    wherein the first frequency is greater than the second frequency.

12. The covering structure of claim 11, wherein the acoustic chip is disposed between the substrate and the covering structure.

13. The covering structure of claim 11, wherein the acoustic chip is a MEMS chip.

14. The covering structure of claim 11, wherein one of the first openings is corresponding to a center of the membrane in a normal direction of the substrate.

15. The covering structure of claim 11, wherein one of the first openings is situated at a center of the covering structure in a top view.

16. The covering structure of claim 11, wherein a top-view pattern of one of the first openings is a hexagon or a circle.

17. The covering structure of claim 11, wherein the covering structure comprises a top part and at least one sidewall part connected to the top part, and the top part has the first openings.

18. The covering structure of claim 11, wherein the acoustic wave related to the membrane of the acoustic chip passes through the first openings of the covering structure.

* * * * *